US006222262B1

(12) United States Patent
Ueno et al.

(10) Patent No.: US 6,222,262 B1
(45) Date of Patent: Apr. 24, 2001

(54) LANTHANUM COBALT OXIDE SEMICONDUCTOR CERAMIC AND RELATED DEVICES

(75) Inventors: Satoshi Ueno, Shiga-ken; Akinori Nakayama, Otsu; Terunobu Ishikawa, Shiga-ken; Hideaki Niimi, Hikone; Yoichi Kawase, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/453,994

(22) Filed: Dec. 3, 1999

(30) Foreign Application Priority Data

Dec. 3, 1998 (JP) ........................................ 10-343864

(51) Int. Cl.[7] ........................ H01L 7/10; H01L 7/04

(52) U.S. Cl. .................. 257/703; 257/705; 257/758; 257/700; 257/771; 257/767; 257/702; 501/152; 501/126; 252/521.1; 252/521.2; 252/519

(58) Field of Search ........................ 257/700–703, 257/758, 705, 765–767, 771, 678; 501/152, 126; 252/521.1, 521.2, 519

(56) References Cited

U.S. PATENT DOCUMENTS

| | | | | |
|---|---|---|---|---|
| 4,033,906 | * | 7/1977 | Nagasawa et al. | 252/519 |
| 4,290,041 | * | 9/1981 | Utsumi et al. | 338/21 |
| 5,401,372 | * | 3/1995 | Liu et al. | 204/295 |
| 5,591,315 | * | 1/1997 | Mazanec et al. | 205/462 |
| 5,703,000 | * | 12/1997 | Nakayama et al. | 501/152 |
| 5,712,220 | * | 1/1998 | Carolan et al. | 502/400 |
| 5,744,015 | * | 4/1998 | Mazanec et al. | 204/295 |
| 5,785,837 | * | 7/1998 | Bhattacharya et al. | 205/74 |
| 6,054,403 | * | 4/2000 | Kawase et al. | 501/152 |

* cited by examiner

*Primary Examiner*—Alexander O. Williams
(74) *Attorney, Agent, or Firm*—Ostrolenk, Faber, Gerb & Soffen, LLP

(57) ABSTRACT

A semiconductor ceramic device includes a semiconductor ceramic sintered body and external electrodes. The semiconductor ceramic sintered body contains a lanthanum cobalt type oxide major component, about 0.1 to 10 mol % on an element conversion basis of an oxide of Cr as a sub-component, and about 0.001 to 0.5 mol % on an element conversion basis of at least one of the oxides of Li, Na, K, Rb, Cs, Be, Mg, Ca, Sr, Ba, Ni, Cu and Zn.

20 Claims, 1 Drawing Sheet

LANTHANUM COBALT OXIDE SEMICONDUCTOR CERAMIC AND RELATED DEVICES

BACKGROUND OF THE INVENTION

1. Field of the Invention

The present invention relates to a semiconductor ceramic having a negative resistance-temperature characteristic, and a semiconductor ceramic device including the same, and more particularly to a semiconductor ceramic especially for use in inrush current control of a switching power supply or the like, temperature compensation of a device such as a quartz oscillator or the like, motor start-up, and so forth, and a semiconductor ceramic device including the same.

2. Description of the Related Art

Conventionally, there are available semiconductor ceramic devices (hereinafter, referred to as an NTC device) having a negative resistance-temperature characteristic (hereinafter, referred to as a negative characteristic) in that the resistance at room temperature is high and decreases with the temperature being raised. The NTC devices are applied in various uses, for example, in temperature compensation type quartz oscillators, inrush current control, motor start-up retardation, halogen lamp protection, and so forth.

For example, temperature compensation type quartz oscillators (hereinafter, referred to as TCXO) used as a frequency source for electronic apparatuses such as communication equipment and so forth. comprise a temperature compensation circuit and a quartz oscillator. A temperature compensation type quartz oscillation device in which a temperature compensation circuit is connected directly to a quartz oscillator in an oscillation loop is called a “direct TCXO”, and that in which a temperature compensation circuit is connected indirectly to a quartz oscillator out of an oscillation loop is called an “indirect TCXO”.

The direct TCXO contains at least two NTC devices in order to temperature compensate the oscillation frequency of the quartz oscillator. One NTC device is used for temperature-compensation at room temperature (25° C.) or lower and has a low resistance at room temperature of about 30 to 150 Ω. The other NTC device is used for temperature compensation at room temperature or higher and has a high resistance at room temperature of about 2000 to 3000 Ω.

In switching power supplies and lighting circuits of halogen lamps, an eddy current flows the moment that a switch is turned on. To prevent the eddy current from flowing, an inrush current controlling NTC device is used for absorbing the inrush current generated in the initial stage. When the power supply switch is turned on, the NTC device absorbs the inrush current in the initial stage to control the eddy current which flows in the circuit. After this, the NTC device, whose temperature is raised due to self-heating, has a lower resistance, and in the stationary state, the power consumption is reduced.

Further, in a motor provided in a gear having a structure such that a lubricating oil starts to be fed therein after the motor is started up, it is preferred that the speed at which the gear is rotated is increased stepwise to a high speed by application of a current. Further, in a lapping machine with which the surface of porcelain is abraded by rotating a grindstone, preferably, a driving motor is started-up, and the lapping machine is rotated with the speed being increased stepwise to a high speed. As a device for retarding the rotation-start time of the gear or the grindstone for a predetermined time at the start-up of the motor, an NTC device for retarding the motor start-up is used. Since the NTC device exhibits a high resistance at the start-up, the motor terminal voltage is reduced so that the start-up of the motor is retarded. After this, the temperature of the NTC device is raised, due to self-heating, and the resistance becomes low. Then, the motor terminal voltage is increased so that the motor is started up. In the stationary state, the motor is normally rotated.

Conventionally, as semiconductor ceramics having a negative resistance-temperature characteristic and constituting these NTC devices, spinel oxides containing transition metal elements such as manganese, cobalt, nickel, copper and so forth have been used.

To temperature-compensate TCXO oscillation frequency at a high precision, it is desirable that the temperature dependency (hereinafter, referred to as B constant) of the resistance of an NTC device is high. In general, spinel oxides containing transition metal elements have a positive correlation between the resistivity at room temperature and the B constant. The higher the resistivity at room temperature, the higher the B constant. Accordingly, the spinel oxides containing transition metal elements are suitable as materials for NTC devices which are required to have a high resistance at room temperature and a high B constant, that is, as materials for NTC devices which are used for temperature compensation at room temperature or higher. However, the spinel oxides are unsuitable as materials for NTC devices which need to have a low resistance at room temperature or lower and a high B constant, namely, as materials for NTC devices which are used for temperature compensation at room temperature or lower. By forming the NTC device so as to have a lamination structure containing plural internal electrodes laminated therein, the resistance of the NTC device can be reduced even though for the NTC device, a material having a high resistivity is used. However, the lamination structure causes the static capacitance of the NTC device to increase. After all, it is difficult to obtain a satisfactory temperature compensation with high precision.

Moreover, when an NTC device is employed for inrush current control, it is necessary that the resistance of the NTC device becomes low in the temperature-rising state caused by the self-heating. Conventional spinel oxides when they are employed show a tendency that the lower the resistivity, the smaller the B constant. Accordingly, the resistance in the temperature rising state is not satisfactorily low. Accordingly, as a method of satisfactorily decreasing the resistance of an NTC device at a high temperature, increasing the area or thinning the thickness is employed when the NTC device has a plate shape, for example. However, increasing the area of the NTC device is contrary to the miniaturization of the device. Also, from the standpoint of maintaining the strength of the NTC device, the thickness of the NTC device can not be thinned extremely. The resistance of the NTC device, even though a material having a high resistivity and a high B constant is used for the NTC device, can be made low by forming the NTC device so as to have a lamination structure in which there are plural internal electrodes. However, since the distances between the opposing internal electrodes are short, an allowable eddy current could not be significantly increased.

It has been revealed by the studies by V. G. Bhide, D. S. Rajoria and others that oxides containing rare earth metal elements have a negative resistance temperature characteristic in which the resistance is decreased in the temperature rising state at a high temperature. The study by A. H. Wlacov and O. O. Shikerowa has shown that as to the characteristics of the $LaCoO_3$ type NTC devices, the resistance of $LaCoO_3$ is low than that of $GdCoO_3$ in general.

However, the $LaCoO_3$ type NTC devices have a low resistivity at room temperature but have a B constant of less than 2000 K. Accordingly, when a $LaCoO_3$ type NTC device is used to control inrush current and the resistance of the $LaCoO_3$ type NTC device is adjusted for controlling the inrush current, the power consumption during the stationary time is increased.

To solve this problem, the inventors have found that the B constant can be enhanced to be 4000 K or higher by addition of an oxide of Cr to a major component comprising a lanthanum cobalt type oxide as reported in Japanese Patent Application No. 9-208310. That is, by controlling the addition range of the oxide of Cr, the B constants at low and high temperatures can be individually controlled. Accordingly, by selecting materials containing the lanthanum cobalt type oxides as major components suitably depending on intended use, materials become available for those various uses, e.g., for control of an inrush current, motor start-up retardation, halogen lamp protection, or the like for where it is required to increase the B constants at high temperatures, and for uses such as TCXO or the like where it is required to enhance the B constants at low temperatures.

Further, when a material containing a lanthanum cobalt type oxide as a major component and an oxide of Cr added thereto is used as a material for a lamination type NTC device, the lamination type NTC device having as low a resistance as a conventional device can be obtained, even though the number of internal electrodes is decreased as compared with a conventional lamination type NTC device. Accordingly, the static capacitance of the lamination type NTC device can be reduced to be lower than that of the conventional device. Further, since the distances between the internal electrodes can be increased, the allowable eddy current can be increased compared with the conventional device.

Further, when a composition containing the lanthanum cobalt type oxide as a major component and an oxide of Cr added thereto is used for an NTC device for controlling an inrush current, the B constant at a high temperature can be enhanced to be 4500 K. However, the B constant at a low temperature presents a value of 4000 K or higher.

Further, since the composition containing the lanthanum cobalt type oxide as a major component and an oxide of Cr added thereto has a high relative dielectric constant, the static capacitance becomes high.

SUMMARY OF THE INVENTION

According to the present invention, there are provided a semiconductor ceramic which has a low resistance in the temperature-rising state, and has an appropriate resistance in the low temperature environment, and semiconductor ceramic devices each including the same. Moreover, there are provided a semiconductor ceramic which is suitable for uses where a low static capacitance is needed, and semiconductor ceramic devices including the same.

To achieve the above object, according to the present invention, there is provided a semiconductor ceramic which containing a lanthanum cobalt type oxide as a major component, an oxide of Cr as a sub-component in an amount of about 0.1 to 10 mol % on an element conversion basis, based on the major component, and at least one of Li, Na, K, Rb, Cs, Be, Mg, Ca, Sr, Ba, Ni, Cu and Zn in an amount of about 0.001 to 0.5 mol % on an element conversion basis, based on the major component.

With the above composition, a semiconductor ceramic having a low resistivity at room temperature, a high B constant, and a low relative dielectric constant can be obtained. When the sum of Li, Na, K, Rb, Cs, Be, Mg, Ca, Sr, Ba, Ni, Cu and Zn exceeds about 0.5 mol %, the B constant becomes low. Accordingly, the sum is selected to be in the range from about 0.001 to 0.5 mol %.

When the lanthanum cobalt type oxide is expressed by the general formula of $La_xCoO_3$ x is selected in the range of $0.500 \geqq x/(1+y) \leqq 0.999$ in which y designates the content of the oxide of Cr on an element conversion basis. When $x/(1+y)$ exceeds 0.999, lanthanum oxide ($La_2O_3$) which does not react in the sintered body reacts with water in the atmosphere, which causes the semiconductor ceramic to be disintegrated. This is unsuitable for practical use of the semiconductor ceramic. On the other hand, when $x/(1+y)$ is less than 0.500, the resistivity of the semiconductor ceramic increases, and the B constant becomes too small.

According to this invention, as to the semiconductor ceramic in which a rare earth element such as Pr, Nd, Sm or the like, or an element such as Bi or the like is substituted for a part of the La of the lanthanum cobalt type oxide having the general formula of $La_xCoO_3$, similar advantages can be obtained.

Further, according to the present invention, there is provided a semiconductor ceramic device which includes any one of the semiconductor ceramics having the above-features and external electrodes provided at the surface of the semiconductor ceramic. Furthermore, according to the present invention, there is provided a semiconductor ceramic device which includes a laminate formed by lamination of the semiconductor ceramics having the above features and internal electrodes, and external electrodes provided at the surface of the laminate and electrically connected to the internal electrodes.

The semiconductor ceramic devices according to the present invention are suitably used for control of an inrush current, retardation of the start-up of a motor, halogen lamp protection and temperature compensation type quartz oscillation. In addition, the semiconductor ceramic devices are used for other temperature compensation circuits and temperature sensing circuits. When the semiconductor ceramic devices are used for control of an inrush current, retardation of the start-up of a motor and halogen lamp protection, the resistance is decreased in the temperature-rising state so that the power consumption is decreased. Accordingly, the semiconductor ceramic devices can cope with a large current. When the semiconductor ceramic devices are used as a temperature compensation type quartz oscillator, the reduction of the impedance is inhibited by decreasing the static capacitance, and thereby, the semiconductor ceramic device can be cope with compensation at a high precision.

In this invention, the amount of Cr or the sum of Li, Na, K, Rb, Cs, Be, Mg, Ca, Sr, Ba, Ni, Cu and Zn is defined as a ratio thereof to the cobalt of the lanthanum cobalt type oxide, e.g., Cr/Co or the like.

Hereinafter, embodiments of the semiconductor ceramic and the semiconductor ceramic devices including the same according to the present invention will be described.

DESCRIPTION OF THE PREFERRED EMBODIMENTS

FIRST EMBODIMENT

Figure 1:
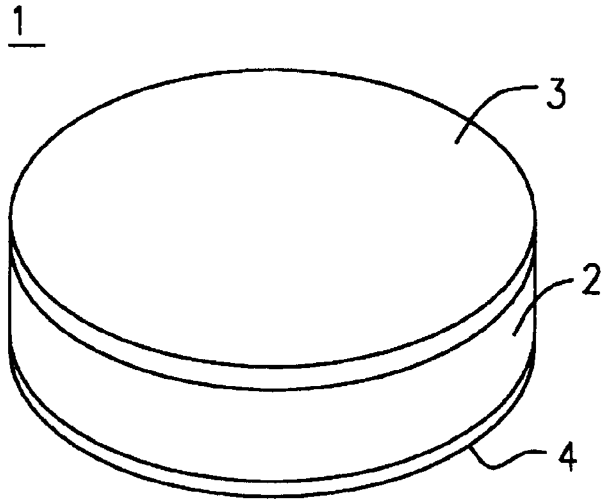
FIG. 1 is a perspective view of a semiconductor ceramic device according to an embodiment of the present invention.

As a first embodiment, a plate-shape semiconductor ceramic device as an example will be described. The plate-shape semiconductor ceramic device is produced as follows.

Compounds containing cobalt such as $CoCO_3$, $CO_3O_4$, CoO or the like, and compounds containing lanthanum such as $La_2O_3$, $La(OH)_3$, or the like were weighed out in such amounts that the mole ratio of lanthanum to the sum of cobalt and chromium was 0.95. Then, compounds containing chromium such as $Cr_2O_3$, $CrO_3$, or the like, and addition elements (Ni, Li, Na, K, Pb, or the like) as shown in Tables 1, 2 and 3 in the form of compounds such as oxides or the like were weighed out in predetermined amounts, respectively, and added. The amounts of the addition elements as shown in Tables 1 through 3 are amounts converted to a respective element basis.

TABLE 1

| Sample Number | Addition Elements Type | Amount (mol %) | Type | Amount (mol %) | Resistivity ρ 25° C. (Ω · cm) | B Constant B (−10° C.) (K) | B (140° C.) (K) |
|---|---|---|---|---|---|---|---|
| 1-1* | Cr | 5 | Ni | 0 | 12.4 | 4070 | 4770 |
| 1-2* | Cr | 5 | Ni | 0.0005 | 12.4 | 4070 | 4770 |
| 1-3 | Cr | 5 | Ni | 0.001 | 13.1 | 3880 | 4700 |
| 1-4 | Cr | 5 | Ni | 0.005 | 14.1 | 3780 | 4620 |
| 1-5 | Cr | 5 | Ni | 0.01 | 15.0 | 3720 | 4580 |
| 1-6 | Cr | 5 | Ni | 0.05 | 17.2 | 3630 | 4420 |
| 1-7 | Cr | 5 | Ni | 0.1 | 18.8 | 3560 | 4350 |
| 1-8 | Cr | 5 | Ni | 0.2 | 20.6 | 3520 | 4190 |
| 1-9 | Cr | 5 | Ni | 0.3 | 22.3 | 3400 | 4160 |
| 1-10 | Cr | 5 | Ni | 0.5 | 23.7 | 3270 | 4100 |
| 1-11* | Cr | 5 | Ni | 0.6 | 24.4 | 2780 | 3820 |
| 1-12* | Cr | 0 | Li | 0.1 | 2.2 | 820 | 2300 |

TABLE 2

| Sample Number | Addition Elements Type | Amount (mol %) | Type | Amount (mol %) | Resistivity ρ 25° C. (Ω · cm) | B Constant B (−10° C.) (K) | B (140° C.) (K) |
|---|---|---|---|---|---|---|---|
| 1-13* | Cr | 0.05 | Na | 0.1 | 7.6 | 2540 | 3410 |
| 1-14 | Cr | 0.1 | K | 0.1 | 16.6 | 3010 | 4050 |
| 1-15 | Cr | 0.5 | Rb | 0.1 | 27.6 | 3750 | 4650 |
| 1-16 | Cr | 1 | Cs | 0.1 | 22.8 | 3910 | 4780 |
| 1-17 | Cr | 2 | Be | 0.1 | 20.0 | 3860 | 4690 |
| 1-18 | Cr | 3 | Mg | 0.1 | 19.1 | 3780 | 4680 |
| 1-19 | Cr | 4 | Ca | 0.1 | 18.8 | 3750 | 4560 |
| 1-20 | Cr | 5 | Sr | 0.1 | 18.6 | 3860 | 4480 |
| 1-21 | Cr | 6 | Ba | 0.1 | 18.1 | 3680 | 4300 |
| 1-22 | Cr | 7 | Ni | 0.1 | 18.5 | 3400 | 4190 |
| 1-23 | Cr | 8 | Cu | 0.1 | 20.2 | 3310 | 4110 |
| 1-24* | Cr | 10 | Zn | 0.1 | 23.8 | 3050 | 3850 |
| Conventional Example 1 | — | — | — | — | 40.0 | 3200 | 2750 |

TABLE 3

| Sample Number | Addition Elements Type | Amount (mol %) | Type | Amount (mol %) | Resistivity ρ 25° C. (Ω · cm) | B Constant B (−10° C.) (K) | B (140° C.) (K) |
|---|---|---|---|---|---|---|---|
| 1-25 | Cr | 5 | Ni | 0.001 | 13.3 | 3860 | 4690 |
| | | | Ca | 0.0005 | | | |
| 1-26 | Cr | 5 | Mg | 0.005 | 14.2 | 3760 | 4620 |
| | | | Cu | 0.001 | | | |
| 1-27 | Cr | 0.5 | Sr | 0.01 | 26.1 | 3770 | 4710 |
| | | | Ba | 0.01 | | | |
| 1-28 | Cr | 0.5 | Zn | 0.05 | 26.8 | 3750 | 4670 |
| | | | Li | 0.01 | | | |
| 1-29 | Cr | 1 | Na | 0.1 | 23.3 | 3880 | 4770 |
| | | | Rb | 0.05 | | | |
| | | | Cs | 0.05 | | | |

TABLE 3-continued

| | Addition Elements | | | | Resistivity ρ | B Constant | |
|---|---|---|---|---|---|---|---|
| Sample Number | Type | Amount (mol %) | Type | Amount (mol %) | 25° C. (Ω · cm) | B (−10° C.) (K) | B (140° C.) (K) |
| 1-30 | Cr | 1 | K<br>Be<br>Ca | 0.1<br>0.1<br>0.1 | 24.0 | 3810 | 4720 |

After this, purified water was added to each of the obtained powders, wet-mixed for 24 hours by use of zirconia balls and dried, and thereafter calcined at a temperature of 900 to 1200° C. for 2 hours. To the calcined powder, a binder was added and mixed by use of zirconia balls, filtered, dried, and then press-molded into a disk plate shape, and fired in the atmosphere at a temperature of 1200 to 1600° C. for 2 hours. As a result, a plate-shape sintered body 2 as shown in FIG. 1 was obtained. Platinum paste was coated onto the both main sides of the plate-shape sintered body 2, and baked in the atmosphere at a temperature of 1100 to 1400° C. for 5 hours to form external electrodes 3 and 4. As a result, a plate-shape semiconductor ceramic device 1 was obtained.

For the semiconductor ceramic device 1 having a negative resistance-temperature characteristic, produced as described above, the resistivity and the B constant were measured. The results are shown in TABLES 1 through 3 (see Sample Numbers 1-1 through 1-30). For comparison, the measurement results of a conventional semiconductor ceramic device are also shown (see the conventional example 1 in TABLE 2). The sample numbers in TABLES 1 and 2 marked with * indicate the samples which presented no characteristics suitable for semiconductor ceramic devices for controlling an inrush current.

The resistivity p was measured at 25° C. The B constant is a constant representing the change of the resistance with the temperature and defined by the following equation;

$$B\ \text{constant}=[\ln \rho(T_0)-\ln \rho(T)]/(1/T_0-1/T)$$

in which ρ (T) and ρ ($T_0$) represent the resistivities at temperatures T and $T_0$, respectively, and in is the natural logarithm.

The higher the B constant, the larger the change of the resistance with temperature. Based on this equation, the B (−10° C.) and the B(140° C.) of the B constant are defined as follows, respectively.

$$B\ (-10°\ C.)=[\ln \rho(-10°\ C.)-\ln\ (25°\ C.)]/[1/(-10+273.15)-1/(25+273.15)]$$

$$B\ (140°\ C.)=[\ln \rho(140°\ C.)-\ln\ (25°\ C.)]/[1/(140+273.15)-1/(25273.15)]$$

As seen in TABLES 1 through 3, when about 0.1 to 10 mol % of the oxide of Cr as a sub-component is contained in $LaCoO_3$ as a major component, and the sum of Li, Na, K, Rb, Cs, Be, Mg, Ca, Sr, Ba, Ni, Cu and Zn is about 0.001 to 0.5 mol %, a semiconductor ceramic of which the B constant is 4000 K or lower at a low temperature and is higher than that of the conventional example 1 at a high temperature can be obtained.

In the above first embodiment, as the lanthanum cobalt type oxide, $La_{0.95}CoO_3$ is described. With semiconductor ceramics having a general formula of $La_xCoO_3$ ($0.500 \leqq x \leqq 0.999$), similar advantages can be obtained.

The semiconductor ceramic device of the conventional example 1 was prepared as follows. $Mn_3O_4$, NiO and CuO were weighed out at a ratio by weight of 7:2:1, respectively, wet-mixed with purified water and a binder by use of zirconia balls of a ball mill for 5 hours, crushed, filtered, dried, and thereafter press-molded into the same disk-plate shape as described in the above first embodiment, and fired in the atmosphere at 1200° C. for 2 hours to obtain a sintered body. Next, silver palladium alloy paste was applied onto the both main sides of the sintered body, and baked in the atmosphere at a temperature of 900 to 1100° C. for 5 hours to form external electrodes. A semiconductor ceramic device was thus obtained.

SECOND EMBODIMENT

As the second embodiment, a plate-shape semiconductor ceramic device will be described, similarly to the above-described first embodiment. The plate-shape semiconductor ceramic device is prepared as follows.

Compounds containing cobalt such as $CoCO_3$, $Co_3O_4$, CoO or the like, and compounds containing lanthanum such as $La_2O_3$, $La(OH)_3$ or the like were weighed out in such amounts that the mole ratio of lanthanum to the sum of cobalt and chromium was 0.95. Then, to the weighed-out powders, compounds containing chromium such as $Cr_2O_3$, $CrO_3$ or the like, and the addition elements as shown in Tables 4, 5 and 6 in the form of oxides or the like were weighed out in predetermined amounts, and added. The amounts of the addition elements as shown in Tables 4 through 6 are the amounts converted to a respective element basis.

TABLE 4

| | Addition Elements | | | | Resistivity ρ | Relative Dielectric | B Constant | |
|---|---|---|---|---|---|---|---|---|
| Sample Number | Type | Amount (mol %) | Type | Amount (mol %) | 25° C. (Ω · cm) | Constant εr | B (−30° C.) (K) | B (140° C.) (K) |
| 2-1* | Cr | 4 | Ni | 0 | 12.5 | 82.0 | 4090 | 4780 |
| 2-2* | Cr | 4 | Ni | 0.0005 | 12.5 | 78.5 | 4080 | 4780 |
| 2-3 | Cr | 4 | Ni | 0.001 | 12.8 | 66.3 | 3960 | 4700 |
| 2-4 | Cr | 4 | Ni | 0.005 | 14.0 | 59.2 | 3900 | 4620 |
| 2-5 | Cr | 4 | Ni | 0.01 | 14.6 | 36.7 | 3850 | 4640 |

TABLE 4-continued

| Sample Number | Addition Elements Type | Amount (mol %) | Type | Amount (mol %) | Resistivity ρ 25° C. (Ω · cm) | Relative Dielectric Constant εr | B Constant B (−30° C.) (K) | B (140° C.) (K) |
|---|---|---|---|---|---|---|---|---|
| 2-6 | Cr | 4 | Ni | 0.05 | 17.1 | 35.1 | 3780 | 4420 |
| 2-7 | Cr | 4 | Ni | 0.1 | 18.6 | 36.1 | 3700 | 4330 |
| 2-8 | Cr | 4 | Ni | 0.2 | 20.7 | 33.0 | 3650 | 4220 |
| 2-9 | Cr | 4 | Ni | 0.3 | 22.1 | 27.6 | 3600 | 4180 |
| 2-10 | Cr | 4 | Ni | 0.5 | 23.8 | 24.0 | 3430 | 4120 |
| 2-11* | Cr | 4 | Ni | 0.6 | 24.3 | 20.2 | 2950 | 3820 |
| 2-12* | Cr | 0 | Li | 0.01 | 2.2 | 82.0 | 820 | 2400 |

TABLE 5

| Sample Number | Addition Elements Type | Amount (mol %) | Type | Amount (mol %) | Resistivity ρ 25° C. (Ω · cm) | Relative Dielectric Constant | B Constant B(−30° C.) (K) | B(140° C.) (K) |
|---|---|---|---|---|---|---|---|---|
| 2-13* | Cr | 0.05 | Na | 0.01 | 7.6 | 73.2 | 2540 | 3430 |
| 2-14* | Cr | 0.1 | K | 0.01 | 15.4 | 67.5 | 3020 | 4070 |
| 2-15 | Cr | 0.5 | Rb | 0.01 | 22.5 | 43.0 | 3870 | 4700 |
| 2-16 | Cr | 1 | Cs | 0.01 | 18.5 | 42.7 | 3890 | 4800 |
| 2-17 | Cr | 2 | Be | 0.01 | 15.1 | 38.0 | 3820 | 4720 |
| 2-18 | Cr | 3 | Mg | 0.01 | 14.8 | 36.0 | 3800 | 4640 |
| 2-19 | Cr | 4 | Ca | 0.01 | 14.7 | 36.5 | 3840 | 4560 |
| 2-20 | Cr | 5 | Sr | 0.01 | 15.3 | 36.1 | 3680 | 4480 |
| 2-21 | Cr | 6 | Ba | 0.01 | 15.7 | 37.2 | 3530 | 4300 |
| 2-22 | Cr | 7 | Ni | 0.01 | 16.3 | 46.6 | 3420 | 4190 |
| 2-23 | Cr | 8 | Cu | 0.01 | 19.4 | 57.5 | 3360 | 4110 |
| 2-24* | Cr | 10 | Zn | 0.01 | 21.4 | 77.3 | 3450 | 3850 |
| Conventional Example 2 | — | — | — | — | 40.0 | 70 | 3250 | 2750 |

TABLE 6

| Sample Number | Addition Elements Type | Amount (mol %) | Type | Amount (mol %) | Resistivity ρ 25° C. (Ω · cm) | Relative Dielectric Constant | B Constant B(−30° C.) (K) | B(140° C.) (K) |
|---|---|---|---|---|---|---|---|---|
| 2-25 | Cr | 4 | Sr<br>Ba | 0.001<br>0.001 | 64.2 | 13.1 | 3940 | 4680 |
| 2-26 | Cr | 4 | Be<br>Cu | 0.005<br>0.001 | 52.6 | 14.2 | 3890 | 4620 |
| 2-27 | Cr | 0.5 | Ni<br>Ca | 0.01<br>0.01 | 43.0 | 22.4 | 3860 | 4710 |
| 2-28 | Cr | 0.5 | Zn<br>Li<br>Be | 0.05<br>0.01<br>0.1 | 42.2 | 26.8 | 3830 | 4670 |
| 2-29 | Cr | 1 | Na<br>K<br>Ce | 0.05<br>0.05<br>0.1 | 37.8 | 23.4 | 3760 | 4770 |
| 2-30 | Cr | 1 | Rb<br>Mg | 0.1<br>0.1 | 34.3 | 24.0 | 3690 | 4710 |

Next, to each of the obtained powders, purified water was added, wet-mixed with nylon balls for 16 hours, dried and calcined at a temperature of 900 to 1200° C. for 2 hours. The calcined powder was crushed with a jet mill. 5 wt. % of a vinyl acetate type binder and purified water were added, mixed by use of nylon balls, filtered, dried, press molded into a disk-plate shape and fired in the atmosphere at a temperature of 1200 to 1600° C. for 2 hours to obtain a plate-shape sintered body 2 as shown in FIG. 1. Silver palladium alloy paste was applied onto the both main sides of the sintered body 2, baked in the atmosphere at a temperature of 900 to 1200° C. for 5 hours to form external electrodes 3 and 4. As a result, a plate-shape semiconductor ceramic device 1 was obtained.

For the semiconductor ceramic device 1 having a negative resistance-temperature characteristic, produced as described above, the resistivity and the B constant were measured in the same manner as in the above-described embodiment 1. The results are shown in TABLES 4 through 6 (see Sample Number 2-1 to Sample Number 2-30). For comparison, the measurement results of a conventional semiconductor ceramic device are also listed (see the conventional example 2 in TABLE 5). In TABLES 4 and 5, the sample numbers marked * indicate the samples which presented no characteristics suitable for the TCXO semiconductor ceramic devices.

The resistivity is measured at 25° C. The B (30° C.) and the B(140° C.) of the B constant are defined as follows, respectively.

$$B\ (-30°\ C.)=[\ln(-30°\ C.)-\text{In}\ (25°\ C.)]/[1/(-30+273.15)-1/(25+273.15)]$$

$$B\ (140°\ C.)=[\ln(140°\ C.)-\text{In}\ (25°\ C.)]/[1/(140273.15)-1/(25273.15)]$$

As seen in TABLES 4 through 6, when about 0.5 to 10 mol % of the oxide of Cr as a sub-component is contained in $LaCoO_3$ as a major component, and the sum of Li, Na, K, Rb, Cs, Be, Mg, Ca, Sr, Ba, Ni, Cu and Zn is about 0.001 to 0.5 mol %, a semiconductor ceramic of which the relative dielectric constant is lower than that of the conventional example 2, and the B constant is higher than that of the conventional example 2 can be obtained.

The semiconductor ceramic device of the conventional example 2 was prepared in the same manner as that for the above-described second embodiment except that $Mn_3O_4$, NiO, and CuO were weight out at a ratio by weight of 7:2:1.

THIRD EMBODIMENT

As a third embodiment, a lamination type semiconductor ceramic device as an example will be described. The lamination type semiconductor ceramic device is prepared as follows.

Compounds containing cobalt such as $CoCO_3$, $Co_3O_4$, CoO or the like, and compounds containing lanthanum such as $La_2O_3$, $La(OH)_3$ or the like were weighed out in such amounts that the mole ratio of lanthanum to the sum of cobalt and chromium was 0.95. Then, to the respective weighed-out powders, compounds containing chromium such as $Cr_2O_3$, $CrO_3$ or the like, and an addition element (Ca) as shown in Table 7 in the form of compounds such as oxides or the like were weighed out in predetermined amounts, respectively, and added. The amount of the addition element as shown in Table 7 is an amount converted to an element basis.

TABLE 7

| | Cr Addition | Addition Element | | Break-Down Capacitor |
|---|---|---|---|---|
| Sample Number | Amount (mol %) | Type | Amount (mol %) | Capacitance (μF) |
| 3-1 | 4 | Ca | 0.1 | 880 |
| Conventional Example 3 | — | — | — | 480 |

Next, to each of the obtained powders, purified water was added, and wet-mixed by use of nylon balls for 16 hours, dried, and thereafter calcined at a temperature of 900 to 1200° C. for 2 hours. The calcined powder was crushed with a jet mill. A binder, a dispersant and water were added, and wet-mixed by use of nylon balls for 12 hours. After this, the mixture was molded into a ceramic green sheet by the doctor blade method.

Next, a platinum paste was applied on the green sheet by a technique such as printing or the like to form an internal electrode. After this, the green sheets were overlaid so that the internal electrodes were opposed to each other. Further, green sheets for protection were placed on the upper side and underside thereof, and press-bonded to produce a green sheet laminate.

Figure 2:
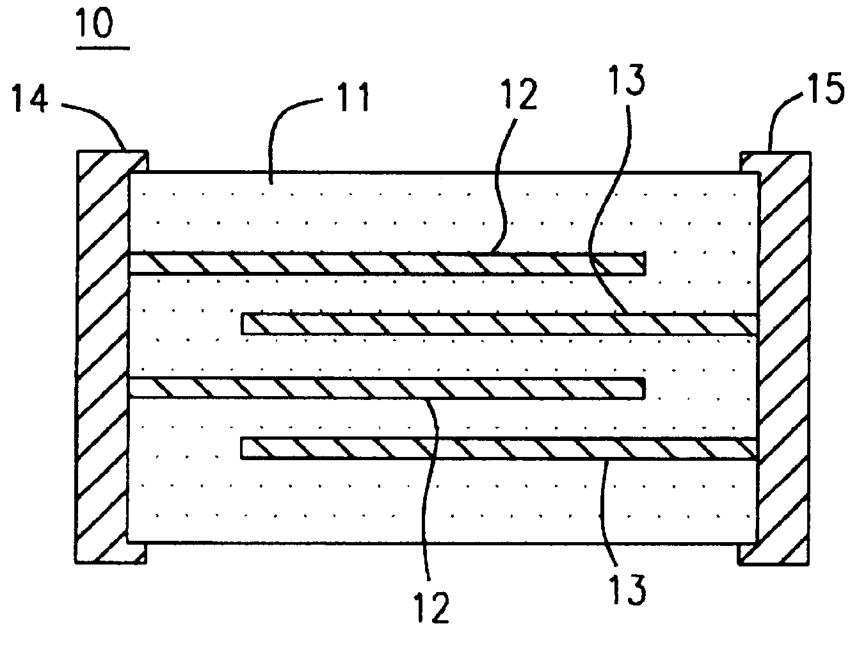
FIG. 2 is a cross section of a semiconductor ceramic device according to another embodiment of the present invention.

Next, the green sheet laminate 11 was cut into a predetermined size and fired at a temperature of 1200 to 1400° C. for 2 hours. As a result, a semiconductor ceramic sintered laminate 10 containing internal electrodes 12 and 13 as shown in FIG. 2 was obtained. After this, electrode paste was made to adhere to the opposite side ends of the sintered laminate 10 by a dipping method, dried, and baked to form external electrodes 14 and 15. Thus, a lamination type semiconductor ceramic device 10 as shown in FIG. 2 was obtained.

The lamination type semiconductor ceramic device 10 having a negative resistance-temperature characteristic produced as described above was connected in series with a switching power supply and the break-down capacitor capacitance at a room temperature was measured. The results are shown in TABLE 7 (see Sample Number 3-1). For comparison, the measurement results of a conventional semiconductor ceramic device are also listed (see the conventional example 3). As seen in TABLE 7, the lamination type semiconductor ceramic device 10 of the third embodiment has a break-down capacitor capacitance larger than that of the conventional example 3, and is adaptable for a large current.

The semiconductor ceramic device of the conventional example 3 was prepared as follows. $Mn_3O_4$, NiO and CuO were weighed out at a ratio by weight of 7:2:1. Purified water was added, wet-mixed by use of zirconia balls for 5 hours, dried, and calcined at 900° C. for 2 hours. To the calcined powder, a binder, a dispersant and water were added, wet-mixed together with zirconia balls for 5 hours, and molded into a ceramic green sheet by a doctor blade method.

Next, platinum paste was applied on the green sheet by a technique such as printing or the like to form an internal electrode. After this, the green sheets were overlaid on each other in such a manner that the internal electrodes were opposed to each other through the green sheet, and also the resistance at room temperature was equal to that of the third embodiment. Moreover, green sheets for protection were placed on the upper side and underside thereof, and press-bonded to form a green sheet laminate. After this, the semiconductor ceramic device was prepared by the same production method as described in the third embodiment.

FOURTH EMBODIMENT

As the fourth embodiment, a lamination type semiconductor ceramic device as an example will be described. similarly to the third embodiment. The lamination type semiconductor ceramic device was prepared as follows.

Compounds containing cobalt such as $CoCO_3$, $Co_3O_4$, CoO or the like, and compounds containing lanthanum such as $La_2O_3$, $La(OH)_3$ or the like were weighed out in such amounts that the mole ratio of lanthanum to the sum of cobalt and chromium was 0.95. After this, to the weighed out powders, compounds containing chromium such as $Cr_2O_3$, $CrO_3$ or the like, and the addition element (Ni) as shown in Table 8 in the form of compounds such as oxides or the like were weighed out in predetermined amounts, respectively, and added. The amount of the addition element as shown in Table 8 is an amount converted to an element basis. By using the obtained powders as materials, the lamination type semiconductor ceramic device 10 as shown in FIG. 2 was produced by the same production method as described in the third embodiment.

TABLE 8

| Sample | Cr Addition Amount | Addition Element Amount | | Static Capacitive | B Constant (K) | |
|---|---|---|---|---|---|---|
| Number | (mol %) | Type | (mol %) | (pF) | B(−30° C.) | B(140° C.) |
| 4-1 | 4 | Ni | 0.1 | 3.3 | 3700 | 4320 |
| Conventional Example 4 | — | — | — | 10.6 | 3250 | 2740 |

For the lamination type semiconductor ceramic device 10 having a negative resistance-temperature characteristic produced as described above, the static capacitance and the B constant were measured. The results are shown in TABLE 8 (see Sample Numbers 4-1). For comparison, the measurement results of a conventional semiconductor ceramic device are also listed (see conventional example 4). As seen in TABLE 8, the lamination type semiconductor ceramic device 10 of the fourth embodiment has a lower static capacitance than that of the conventional example 4, and thereby, the accuracy of temperature compensation can be enhanced. The semiconductor ceramic device of the conventional example 4 was prepared in the same production method as described in the conventional example 3.

OTHER EMBODIMENTS

The semiconductor ceramic and the semiconductor ceramic devices each including the same according to the present invention are not limited to the above-described embodiments. For example, in the first and second embodiments, the case where the lanthanum cobalt type oxides are $La_xCoO_3$ is described. In the case of lanthanum cobalt type oxides in which rare earth elements such as Pr, Nd, Sm or the like and elements such as Bi or the like are substituted for a part of the La, similar advantages can be obtained.

The semiconductor ceramic devices each are not limited to the disk plate shape and the lamination type. The semiconductor ceramic devices may have another shape and size, namely, may be a cylindrical device, an angular chip device, and so forth. Further, for the external electrodes of the semiconductor ceramic devices, silver palladium alloys and platinum were used. However, when electrode materials such as silver, palladium, chromium or their alloys are used, similar characteristics can be also obtained.

As seen in the above-description, by incorporating the oxide of Cr as a sub-component and at least one of the oxides of Li, Na, K, Rb, Cs, Be, Mg, Ca, Sr, Ba, Ni, Cu and Zn into the lanthanum cobalt type oxide as a major component, a semiconductor ceramic according to the present invention can be obtained which has a negative resistance-temperature characteristic, and has a low relative dielectric constant and a B constant at a low temperature of less than 4000 K with the B constant at a high temperature being maintained at 4000 K or higher.

Accordingly, by use of this semiconductor ceramic, a semiconductor ceramic device which can cope with circuits where inrush current is high, and circuits requiring current control at a high precision. In a TCXO circuit, a semiconductor ceramic device having such a negative resistance temperature characteristic that can cope with the high precision compensation can be obtained. That is, the semiconductor ceramic devices according to the present invention can be widely used as devices for protecting against inrush-current, in which excess current flows at the initial application of a voltage, such as general circuits for motor start-up retardation, protection of a laser printer drum, halogen lamp protection, and electric globes, other than devices for preventing an inrush current in a switching power supply, and as devices for TCXO temperature compensation or general temperature compensation, and as sensing devices.

What is claimed is:

1. A semiconductor ceramic comprising a lanthanum cobalt oxide, about 0.1 to 10 mol % on an element conversion basis based on the cobalt in the lanthanum cobalt oxide of an oxide of Cr, and about 0.001 to 0.5 mol % on an element conversion basis based on the cobalt in the lanthanum cobalt oxide of at least one oxide of an element selected from the group consisting of Li, Na, K, Rb, Cs, Be, Mg, Ca, Sr, Ba, Ni, Cu and Zn.

2. A semiconductor ceramic according to claim 1, wherein the content of the oxide of Cr is about 0.5 to 10 mol % and the content of said at least one oxide about 0.002 to 0.3 mol %.

3. A semiconductor ceramic according to claim 2, wherein said lanthanum cobalt oxide is $La_xCoO_3$ in which $0.500 \leqq x/(1+y) \leqq 0.999$, wherein y is the content of th e Cr oxide on an element conversion basis.

4. A semiconductor ceramic according to claim 3, wherein said at least one oxide comprises an oxide of Ni or Ca.

5. A semiconductor ceramic according to claim 2, containing oxides of at least two different elements selected from the group consisting of Li, Na, K, Rb, Cs, Be, Mg, Ca, Sr, Ba, Ni, Cu and Zn.

6. A semiconductor ceramic according to claim 1, wherein said lanthanum cobalt oxide is $La_xCoO_3$ in which $0.500 \leqq x/(1+y) \leqq 0.999$, wherein y is the content of the Cr oxide on an element conversion basis.

7. A semiconductor ceramic according to claim 6, wherein said at least one oxide comprises an oxide of Ni or Ca.

8. A semiconductor ceramic according to claim 6, containing oxides of at least two different elements selected from the group consisting of Li, Na, K, Rb, Cs, Be, Mg, Ca, Sr, Ba, Ni, Cu and Zn.

9. A semiconductor ceramic according to claim 1, wherein said at least one oxide comprises an oxide of Ni or Ca.

10. A semiconductor ceramic according to claim 1, containing oxides of at least two different elements selected from the group consisting of Li, Na, K, Rb, Cs, Be, Mg, Ca, Sr, Ba, Ni, Cu and Zn.

11. A semiconductor ceramic device comprising a semiconductor ceramic according to claim 1 and external electrodes on two surfaces of said semiconductor ceramic.

12. A semiconductor ceramic device according to claim 11, comprising an inrush current control, a motor start-up control, a halogen lamp protector or a temperature compensation quartz oscillator.

13. A semiconductor ceramic device comprising a semiconductor ceramic according to claim 11 having at least one pair of internal electrodes therein and separated by a quantity of said semiconductor ceramic, and wherein each one of said pair is electrically connection on a different one of said external electrodes.

14. A semiconductor ceramic device comprising a laminate of a plurality of layers of semiconductor ceramic according to claim 1, at least one pair of internal electrodes each of which is disposed between adjacent ones of said layers, and a pair of external electrodes at different surfaces of said laminate each of which is electrically connected to a different internal electrode.

15. A semiconductor ceramic device comprising a semiconductor ceramic according to claim 3 and external electrodes on two surfaces of said semiconductor ceramic.

16. A semiconductor ceramic device comprising a semiconductor ceramic according to claim 15 having at least one pair of internal electrodes therein and separated by a quantity of said semiconductor ceramic, and wherein each one of said pair is electrically connection on a different one of said external electrodes.

17. A semiconductor ceramic device comprising a laminate of a plurality of layers of semiconductor ceramic according to claim 3, at least one pair of internal electrodes each of which is disposed between adjacent ones of said layers, and a pair of external electrodes at different surfaces of said laminate each of which is electrically connected to a different internal electrode.

18. A semiconductor ceramic device comprising a semiconductor ceramic according to claim 4 and external electrodes on two surfaces of said semiconductor ceramic.

19. A semiconductor ceramic device comprising a semiconductor ceramic according to claim 18 having at least one pair of internal electrodes therein and separated by a quantity of said semiconductor ceramic, and wherein each one of said pair is electrically connection on a different one of said external electrodes.

20. A semiconductor ceramic device comprising a laminate of a plurality of layers of semiconductor ceramic according to claim 4, at least one pair of internal electrodes each of which is disposed between adjacent ones of said layers, and a pair of external electrodes at different surfaces of said laminate each of which is electrically connected to a different internal electrode.

* * * * *